United States Patent [19]
Kagerbauer

[11] Patent Number: 5,877,710
[45] Date of Patent: Mar. 2, 1999

[54] OPERATIONAL PARAMETER NON-LINEAR REGULATION PROCESS AND CIRCUITRY

[75] Inventor: Gottfried Kagerbauer, Nürnberg, Germany

[73] Assignee: Grundig AG, Fuerth, Germany

[21] Appl. No.: 776,501

[22] PCT Filed: Jul. 27, 1995

[86] PCT No.: PCT/EP95/02968

§ 371 Date: Jan. 24, 1997

§ 102(e) Date: Jan. 24, 1997

[87] PCT Pub. No.: WO96/04595

PCT Pub. Date: Feb. 15, 1996

[30] Foreign Application Priority Data

Jul. 29, 1994 [DE] Germany ............ 44 26 885.8

[51] Int. Cl.⁶ .................................................. H03N 11/00
[52] U.S. Cl. ......................... 341/35; 318/603; 200/20
[58] Field of Search ................ 341/20, 35; 318/603; 417/18; 200/20

[56] References Cited

U.S. PATENT DOCUMENTS 4,203,063  5/1980  Loeb ............................ 318/603
5,189,355  2/1993  Larkins .......................... 348/685
5,366,346  11/1994  Danby ........................... 341/35

FOREIGN PATENT DOCUMENTS 0290803  11/1988  European Pat. Off. .
2757593  7/1979  Germany .
3605088  11/1987  Germany .

*Primary Examiner*—Michael Horabik
*Assistant Examiner*—Albert K. Wong
*Attorney, Agent, or Firm*—Paul Vincent

[57] ABSTRACT

Pulse generators are known for setting an operational parameter, for example volume. They allow a more precise adjustment thanks to a larger angle of rotation than that of potentiometers. Because of the increased angle of rotation, however, fast adjustments are possible only within limits. In general, several turns are required to set the volume to zero, for example. In order to avoid this inconvenience, the speed of rotation and the direction of rotation of the pulse generator are evaluated. If the pulse generator is quickly actuated, this is recognized by a control unit which sets the parameters to a stored value. Evaluating the direction of rotation allows various different stored values to be distinguished from each other.

5 Claims, 1 Drawing Sheet

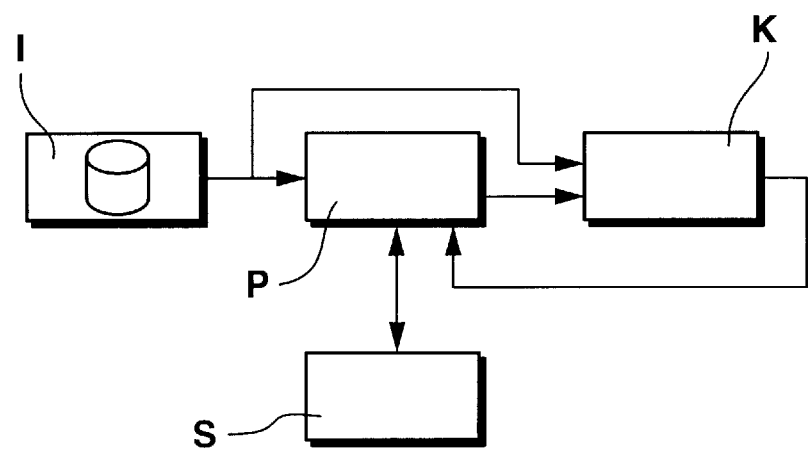
Figure

5,877,710

OPERATIONAL PARAMETER NON-LINEAR REGULATION PROCESS AND CIRCUITRY

BACKGROUND OF THE INVENTION

The invention concerns a method for non-linear regulation of operational parameters with which the change in the operational parameter transpires proportional to the angle of rotation of a knob and the rotational speed of the knob is determined. The invention also concerns a circuitry for carrying out this method having an impulse generator operated by the user and a circuit for determination of the direction of rotation of the impulse generator, the output signals of which are introduced to a control unit.

Known in the art from DE 36 05 088 A1 is an operating device having a rotating knob for selection of differing operational states. In a recording device having this type of operational device, the speed of the recording medium is regulated in dependence on the rotational velocity of the rotating knob. Towards this end a proportional coupling obtains between the rotational velocity of the rotating knob and the speed of the recording medium.

This configuration has the disadvantage that it is not possible to rapidly change the velocity of the recording medium, since a plurality of rotations of the rotating knob are necessary for a very precise regulation or since the velocity cannot be adjusted to a sufficiently accurate degree in the event that the entire regulation region is set using only one turn.

Known in the art from EP 290 803 B1 is a single-knob operation for shunting in magnetic tape video recorders. The transport speed is determined in dependence on the setting of a rotating knob. The speed with which the rotating knob operates is, however, not evaluated.

This system has the disadvantage that it is either not possible to adjust the tape velocity in a sufficiently rapid manner or that the adjustment is too imprecise.

Known in the art from U.S. Pat. No. 4,203,063 is a method and an appropriate configuration for automatically setting a frequency adjustor when retrieving stored frequencies. Towards this end, a desired frequency value is introduced from the memory to a comparator which undertakes a comparison with the currently set value. In the event that the difference between the set value and the desired value is large, the comparator produces a signal for rapid change; if the difference is average, the comparator produces a signal for normal adjustment, and in the event that the difference is small, the comparator produces a signal for slow adjustment. The current signal is then introduced via a digital to analog converter to a motor which changes the frequency adjustor with the appropriate velocity. In this fashion, a method and a circuitry for differing adjustment speeds of a stored frequency is realized in the art using a frequency adjustor.

This system has the disadvantage that the change of frequency during a setting procedure is always dependent upon the motor speed with which the frequency adjuster is rotated. In this fashion, a linear interdependence between frequency and angle of rotation always obtains. In the event that the frequency should be changed substantially, it is necessary to turn for a sufficiently long amount of time until the entire intermediate region is passed-through.

SUMMARY OF THE INVENTION

It is therefore the purpose of the present invention to facilitate both a precise setting of operational parameters as well as to provide for the possibility of rapidly changing the setting.

This purpose is achieved in accordance with the invention through a method characterized in that during operation of the knob and when exceeding a threshold value for the rotational speed, the operational parameter is set in dependence on the rotational direction and/or on the parameter currently set largely without delay to an extreme value or to a parameter value stored therefor. This purpose is achieved in accordance with the invention in a circuitry characterized in that the control unit has a counter which counts the number of pulses per unit time in the output signal of the impulse generator and the control unit comprises a comparator which compares the output signal of the counter to a threshold read-out of a memory and a memory is provided for storage of threshold values, extreme values, and frequently used values of differing operational parameters, and the control unit has means for reading-out one of the stored values for the chosen operational parameters from the memory in dependence on the angle of direction in the event that the quotient of the number of pulses per unit time exceeds the stored threshold with same being utilized for further operation.

The method in accordance with the invention has the advantage that a change in the parameter to be adjusted is effected which is proportional to the angle of rotation using a pulse generator which turns only slowly or with normal speed, said change being choosable sufficiently small to facilitate a very precise adjustment. In the event that the pulse generator turns rapidly, stored values are set which are independent of the angle of rotation. In this fashion a very rapid as well as a very precise change in parameters is possible.

Advantageous embodiments can be derived from the dependent claims.

The circuitry in accordance with invention has the advantage that same realizes an adjustment of the parameters in dependence on both the angle of rotation of the impulse generator as well as on the rotation velocity of the pulse generator.

Towards this end a microprocessor, which is in any event normally available, can be used therefor.

The invention is more closely explained and described below in the embodiment represented in the drawing.

The figure shows a block diagram of the circuitry in accordance with the invention giving one possibility for a circuit configuration which is technically achievable.

DESCRIPTION OF THE PREFERRED EMBODIMENT

The embodiment considers volume adjustment in a receiver. In particular in automobile radios, operational elements must be used which are as small as possible since the amount of room in the front panel is extremely limited. Towards this end only a small regulator is provided for the volume. In order to be able to achieve a sufficiently accurate adjustment of the volume with this type of regulator, it is necessary to expand the regulation region over a plurality of turns of the rotating knob of the regulator. This, however, prevents rapid adjustment of the volume which could, for example, be required when approaching an emergency vehicle or when receiving a telephone call.

Therefore for slow or normal operational speed of the volume adjustment knob, the change in the volume is in conventional dependence on the angle of rotation. The proportionality between the angle of rotation and the change in the volume caused thereby is correlated in such a fashion that even small changes in volume can be adjusted. In this fashion one normally obtains rotational angles in excess of 360 degrees which can be realized utilizing a pulse generator.

In addition to the conventional linear regulation, a rapid rotation of the knob leads to a volume setting which is no longer proportional to the angle of rotation. Rather a stored volume is set in dependence on the direction of rotation. If the knob is rapidly rotated in the direction towards reduced volume, the volume is set to zero and the automobile radio is muted. In the event that the knob is subsequently rapidly rotated in the direction of larger volumes an average volume (normal room volume) or the preceding volume is set. Setting to an intermediate volume requires storage of appropriate parameter values for volume as well as other adjustable parameters in a memory S e.g. during manufacture. Setting of the previously chosen volume is effected by writing same automatically in a memory s in association with a rapid change of this kind and same is read-out and set during a subsequent second rapid rotation of the knob in the other direction.

In this fashion it is also possible to prevent (e.g. due to improper operation) a sudden or undesired excessive volume since same can only be set slowly in dependence on the angle of rotation and not through reading-out a large volume value from the memory S.

When utilized in a regulator for weighting of higher or lower frequencies in the output signal, a particularly rapid rotation of the regulator leads to the setting of an average value or to a maximum or minimum value.

The circuitry for realizing this method comprises a pulse generator I operated by the user. The output signal of the pulse generator I is introduced to a microprocessor which serves as a control unit P for the apparatus. After evaluation of the number of pulses per unit time (which is a measure of the speed of rotation) this number is compared with a stored threshold using a comparator K. In addition, comparison of sequential output signals from the impulse generator I by means of the control unit P leads to determination of the direction of rotation. In the event that the threshold is exceeded the control unit P reads a maximum or minimum value out of memory S in dependence on the rotational direction of the pulse generator I determined by the control unit P and in dependence on the previously set value and the parameter to be changed is set thereto. The memory S is therefore accessed by the control unit P in dependence on the parameter to be changed, the rotation direction and the previously set value.

I claim:

1. Method for substantially continuous change of an operational parameter proportional to a rotation angle of a knob and for discontinuous change thereof in dependence on a rotational speed of the knob, the method comprising:

determining the rotational speed and a rotational direction of the knob;

comparing the determined rotational speed to a threshold value therefor to determine if said rotational speed exceeds said threshold value; and automatically setting, if said rotational speed exceeds said threshold value, the operational parameter to a stored value dependent only on said rotational direction and independent of the rotation angle.

2. The method of claim 1, wherein determining the rotation speed comprises evaluating a number of pulses per unit time of an impulse generator operated by a user via the knob.

3. The method of claim 2, wherein at least one of a volume, a high and low, and a balance of a multi-channel playback device is regulated.

4. The method of claim 3, wherein, between a minimum and a normal value, additional intermediate values are provided for rapid adjustment of a current operational parameter.

5. Circuit for non-linear regulation of operational parameters comprising:

an impulse generator operated by a user and generating output pulses proportional to a rotation angle;

a circuit means for determining a direction of rotation of said impulse generator;

a control unit having a counter for counting a number of said output pulses per unit time, said control unit also having a comparator for comparing said number to a threshold value; and a memory for storage of said threshold value and for storage of at least one of a minimum value, a maximum value, a normal value, and a preceding value of an operational parameter, wherein said control unit accesses said memory to read out and set a stored operational parameter value in dependence on said rotational direction only and independent of said rotation angle when said number exceeds said threshold value.

* * * * *